(12) United States Patent
Viswanath et al.

(10) Patent No.: US 11,067,440 B2
(45) Date of Patent: Jul. 20, 2021

(54) HYBRID LEAKAGE-COMPENSATION SCHEME FOR IMPROVED CORRECTION RANGE

(71) Applicant: TEXAS INSTRUMENTS INCORPORATED, Dallas, TX (US)

(72) Inventors: Rakul Viswanath, Bengaluru (IN); Nagesh Surendranath, Bengaluru (IN); Sandeep Kesrimal Oswal, Bengaluru (IN); Ratna Kumar Venkata Parupudi, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 209 days.

(21) Appl. No.: 16/437,108

(22) Filed: Jun. 11, 2019

(65) Prior Publication Data
US 2020/0393294 A1 Dec. 17, 2020

(51) Int. Cl.
*G01J 1/44* (2006.01)
*H03K 5/24* (2006.01)

(52) U.S. Cl.
CPC ........... *G01J 1/44* (2013.01); *G01J 2001/442* (2013.01); *G01J 2001/444* (2013.01); *H03K 5/24* (2013.01)

(58) Field of Classification Search
CPC .. G01J 1/44; G01J 2001/442; G01J 2001/444; H03F 1/26; H03K 5/24
See application file for complete search history.

(56) References Cited

U.S. PATENT DOCUMENTS

| | | | |
|---|---|---|---|
| 3,684,378 | A | 8/1972 | Lord |
| 10,180,351 | B2 | 1/2019 | Viswanath et al. |
| 2011/0031419 | A1 | 2/2011 | Fukui |
| 2017/0160129 | A1 | 6/2017 | Viswanath et al. |
| 2020/0264039 | A1* | 8/2020 | Surendranath ............ G01J 1/44 |

OTHER PUBLICATIONS

Szczygiel: "Krummenacher feedback analysis for High-count-rate semiconductor pixel detector readout." Mixed Design of Integrated Circuits and systems (MIXDES), 2010 Proceedings of the 17th International Conference, IEEE, 2010.

* cited by examiner

*Primary Examiner* — Kevin K Pyo
(74) *Attorney, Agent, or Firm* — John R. Pessetto; Charles A. Brill; Frank D. Cimino

(57) ABSTRACT

A dark current compensation circuit comprises a first comparator having inputs for a detection signal and a first voltage, and a second comparator having inputs for the detection signal and a second voltage. The dark current compensation circuit also comprises a controller coupled to the first and second comparators, which has an input for an event signal. An adjustable current source is coupled to the controller and configured to generate a compensation current. The controller adjusts a value of the compensation current based on the first and second comparator outputs and maintains a constant value in response to the event signal indicating photons incident on a photon detector. In some implementations, the dark current compensation circuit further comprises an analog sub-circuit coupled to the adjustable current source and configured to receive the detection signal. The analog sub-circuit generates an analog compensation current in response to the detection signal.

19 Claims, 4 Drawing Sheets

HYBRID LEAKAGE-COMPENSATION SCHEME FOR IMPROVED CORRECTION RANGE

BACKGROUND

Photon counting systems employ sensors that react to photon inputs where inputs to the photon counting system are asynchronous. The number of photons arriving in unit time follows the Poisson distribution and the inter-arrival times between photons follows an exponential distribution. Theoretically, two photons may arrive with an infinitesimally small duration between them. Thus, it may not be possible to count all photons distinctly using a finite bandwidth system. However, finite bandwidth counting systems can compensate for the loss of counts as long as the system dead-time is well defined. The dead-time of a counting system may refer to the minimum separation in time between two incoming photons so that they are both recorded distinctly.

Counting systems with a higher dead-time are likely to experience error due to variation on dead-time and other non-idealities. Hence, to achieve suitable system performance, it is desirable that the dead-time be held as small as possible. The detector's response time contributes to the counting system's dead-time. To control the detector's response time, the detector can be biased with a very large reverse bias, for example up to 2000V. As a result, a leakage current flows through the detector even in the absence of incident photons. This leakage current is known as 'dark current.' The current pulses resulting from a photon incident on the detector override the dark current. However, if not compensated for, the dark current can limit the dynamic range of the counting system and cause energy resolution issues within the counting system.

SUMMARY

In some implementations, a dark current compensation circuit includes two comparators, a controller, and an adjustable current source. The first comparator receives an upper voltage threshold and a detection signal representing photons incident on a photon detector, and outputs a logic high signal in response to the detection signal being greater than the upper voltage threshold. The second comparator receives a lower voltage threshold and the detection signal, and output a logic high signal in response to the detection signal being less than the lower voltage threshold. The controller receives the output signals from the first and second comparators and an event signal, and causes the adjustable current source to generate a compensation current. The controller causes the adjustable current source to maintain a value of the compensation current without adjustment in response to the event signal being logic high.

In some implementations, the dark current compensation circuit also includes an analog sub-circuit coupled to an output of the adjustable current source and configured to receive the detection signal. The analog sub-circuit adjusts a value of the compensation current while the controller causes the adjustable current source to maintain a value of the compensation current without adjustment in response to the event signal being logic high. The analog sub-circuit also reduces the active correction range of the controller.

In some implementations, the controller comprises a counter and a gate. The counter is configured to increment in response to the first comparator output being logic high and decrement in response to the second comparator output being logic high. The gate is configured to prevent a change in the compensation current generated by the adjustable current source while the event logic signal is logic high.

BRIEF DESCRIPTION OF THE DRAWINGS

For a detailed description of various examples, reference will now be made to the accompanying drawings in which.

DETAILED DESCRIPTION

Figure 1:
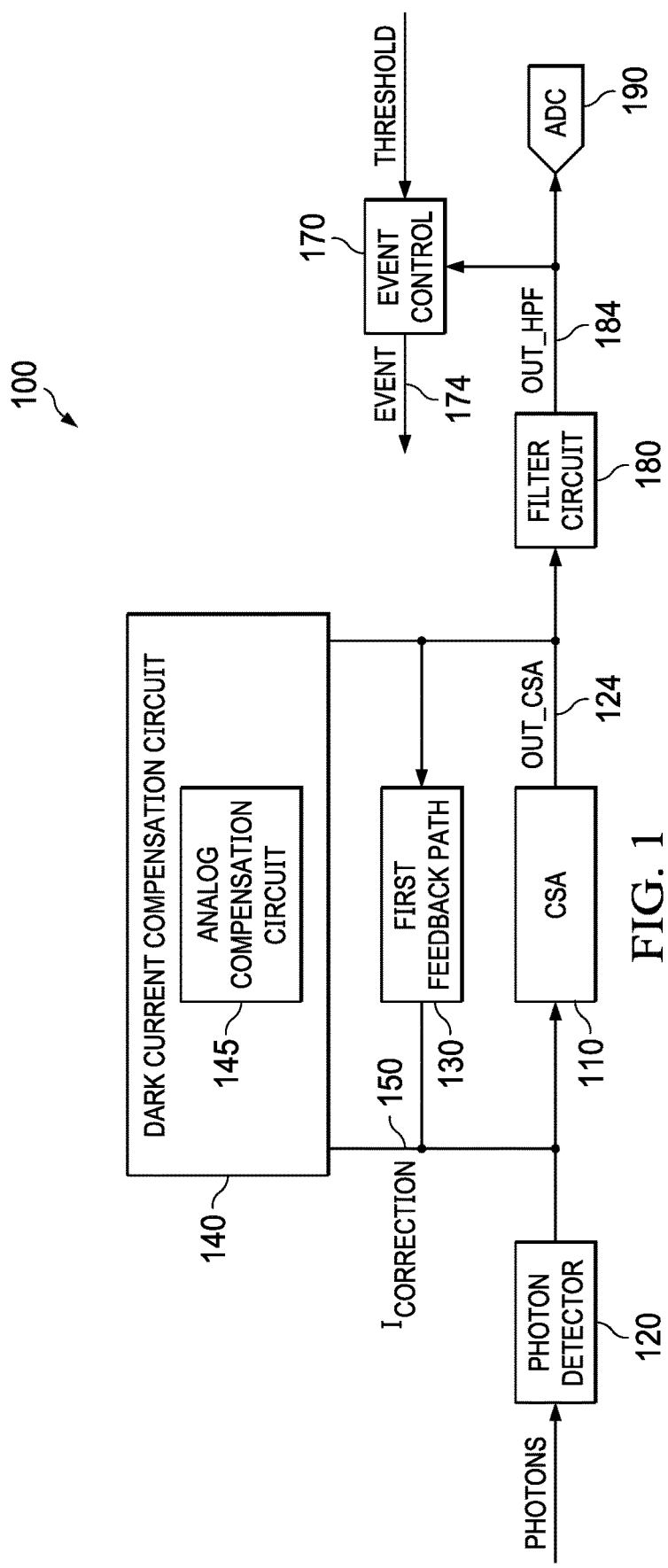
FIG. 1 illustrates an example photon counting system including a dark current compensation circuit.

Dark currents due to the very large reverse bias of photon detectors can limit the dynamic range of the photon counting system and can cause energy resolution issues within the counting system. The amount of dark current at any given point in time may vary based on the temperature of the photon detector, the number of photon incident on the detector, and the quality of the photon detector itself. For example, if the dark current compensation circuit in a photon counting system has a limited dynamic range, the photon counting system must include a high quality photon detector which produces very small amounts of dark current and the photon counting system must be used in a strictly controlled environment without large temperature variations. This limits the practical applications for the photon counting system.

As used herein, the terms 'dark current' and 'leakage current' refer to unwanted current from a photon detector that is unrelated to the current associated with photon incident on the detector. The dark current from a photon detector can vary based on temperature changes and/or an average photon flux at the detector, where a greater number of photons incident on the detector can cause a greater dark current.

The disclosed circuits compensate for dark currents using a digital controller to adjust a compensation signal, allowing the disclosed circuits to compensate for a wide range of dark currents. The wide dynamic range of the disclosed compensation circuits give the photon counting system greater flexibility in both photon detector quality and environmental conditions. The temperature of the counting system need not be carefully controlled to keep the dark current below a certain threshold. The disclosed circuits also avoid adjusting the compensation signal in response to photons incident on the detector and an event detection signal. Some of the disclosed compensation circuits include an analog compensation circuit in addition to the digital compensation circuit, which compensates for residue current at a finer resolution than the digital compensation circuit and reduces the active correction range for the digital compensation circuit.

In one example, a digital dark current compensation circuit includes two comparators, a digital controller and an adjustable current source. The first comparator receives an upper voltage threshold and a signal representing the photon current and dark current received by a photon detector, and outputs a logic high signal in response to the signal representing the photon current and dark current being greater than the upper voltage threshold. The second comparator receives a lower voltage threshold and the signal representing the photon current and dark current, and outputs a logic high signal in response to the signal representing the photon current and dark signal being less than the lower voltage threshold.

The digital controller receives the outputs of the two comparators and an event detection signal, which is logic high in response to one or more photons incident on the photon detector. The digital controller adjusts a compensation current generated by the adjustable current source, but avoids adjusting the compensation current in response to the event detection signal being logic high. This prevents the digital controller from responding to voltage transients due to photons incident on the photon detector and causing energy drift in the signal representing the photon current and dark current.

In some examples, the dark current compensation circuit includes an analog compensation circuit which provides an impedance in parallel with the digital compensation circuit and a corresponding voltage drop across it. The analog compensation may be any appropriate analog circuit providing an impedance within dark current compensation circuit. The analog compensation circuit reduces the active correction range of the digital compensation circuit and allows adjustment to the compensation current in response to voltage transients due to photons incident on the photon detector. The analog compensation circuit also corrects residue dark current at a finer resolution than the digital compensation circuit.

FIG. 1 illustrates an example photon counting system 100 including a dark current compensation circuit. Photon counting system 100 includes a charge sensitive amplifier (CSA) 110 with an input to receive a dark current and a photon current from photon detector 120. CSA 110 generates an output signal OUT_CSA 124 that represents photons and dark current received from detector 120 at the input. CSA 110 includes a first feedback path 130 to feedback OUT_CSA 124 to the input of CSA 110. A dark current compensation circuit 140 generates a dark current correction signal Icorrection 150 to offset dark current from detector 120 at the input of CSA 110.

Compensation circuit 140 compares OUT_CSA 124 to an upper voltage threshold and a lower voltage threshold and adjusts a value of Icorrection 150 in response to OUT_CSA 124 being greater than the upper voltage threshold or less than the lower voltage threshold. Dark current compensation circuit 140 does not adjust a value of Icorrection 150 when an event is detected. In some examples, dark current compensation circuit 140 includes an analog compensation circuit 145 to adjust a value of Icorrection 150 when an event is detected.

A filter circuit 180 receives OUT_CSA 124 from CSA 110 and outputs filtered signal OUT_HPF 184. An analog to digital converter (ADC) 190 records the photon energy level of OUT_HPF 184. An event control circuit 170 also receives OUT_CSA 124 from CSA 110 and a threshold voltage, and outputs a signal EVENT 174, which is indicative of photons incident on detector 120. In response to OUT_CSA 124 being greater than the threshold voltage, EVENT 174 is logic high, indicating one or more photons are incident on detector 120. In response to OUT_CSA 124 being less than the threshold voltage, EVENT 174 is logic low, indicating no photons are incident on detector 120.

In some examples, first feedback path 130 includes a capacitor coupled between the output of CSA 110 to the input of CSA 110 to integrate the photon current and the dark current from photon detector 120. A reset switch in parallel with the capacitor can be used to discharge the capacitor based on a reset signal. A delay circuit can be used to generate the reset signal from EVENT 174.

Figure 2:
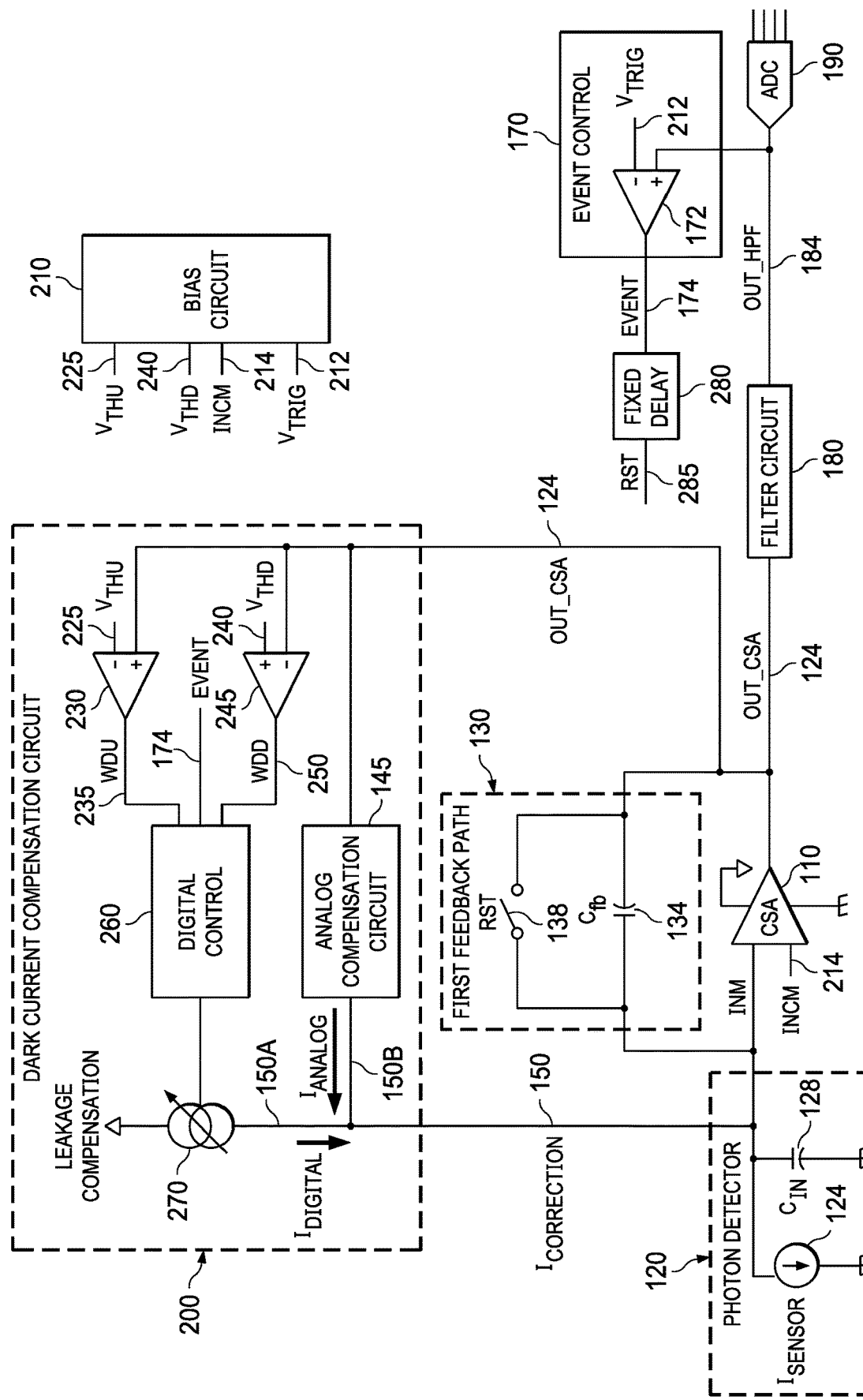
FIG. 2 illustrates an example dark current compensation circuit in a photon counting system.

FIG. 2 illustrates an example dark current compensation circuit 200 in the example photon counting system 100 of FIG. 1. Photon detector 120 can be modeled as a current source Isensor 124 in parallel with a parasitic capacitance Cin 128. CSA 110 receives an input bias voltage INCM 214 from bias circuit 210 to mitigate common mode voltages at input INM of CSA 110. Bias circuit 210 also generates an upper threshold voltage Vthu 225 and a lower threshold voltage Vthd 240 for compensation circuit 200.

First feedback path 130 includes a capacitor Cfb 134 to integrate OUT_CSA 124 with respect to the input signal INM to CSA 110 from photon current and dark current from photon detector 120 and Icorrection 150. Event control 170 includes a comparator 172, which receives a predetermined trigger voltage Vtrig 212 from bias circuit 210 and generates EVENT 174. EVENT 174 can be used to prevent adjustments to Icorrection 150 while photons are detected by photon detector 120. A delay circuit 280 generates a reset signal RST 285 from EVENT 174. RST 285 is used as a control signal for RST switch 138 in first feedback path 130, which discharges Cfb 134 when closed.

Dark current compensation circuit 200 receives OUT_CSA 124, EVENT 174, Vthu 225, and Vthd 240. A first watchdog comparator 230 in compensation circuit 200 receives Vthu 225 and OUT_CSA 124 and outputs an upper watchdog signal WDU 235, which is logic high in response to OUT_CSA 124 being greater than Vthu 225 and logic low in response to OUT_CSA 124 being less than Vthu 225. A second watchdog comparator 245 in compensation circuit 200 receives Vthd 240 and OUT_CSA 124 and outputs a lower watchdog signal WDD 250, which is logic high in response to OUT_CSA 124 being less than Vthd 240 and logic low in response to OUT_CSA 124 being greater than Vthd 240. Digital control 260 receives WDU 235 from watchdog comparator 230 and WDD 250 from watchdog comparator 245, as well as EVENT 174 from event control 170.

The upper voltage threshold Vthu 225 and the lower voltage threshold Vthd 240 can be chosen such that any residual error in Idigital 150A of Icorrection 150 greater than the resolution of adjustable current source 270 triggers one of watchdog comparators 230 and 245. For example, in an example dark current compensation circuit without an analog compensation circuit, an adjustable current source has a resolution of 10 nanoamperes (nA) and bias voltage INCM is 250 millivolts (mV). A 10 nA change in the dark current causes a residual error in Icorrection 150 and a corresponding change in the voltage of OUT_CSA, for example 5 mV. The upper voltage threshold is chosen to be 255 mV and the lower voltage threshold is chosen to be 245 mV. The 10 nA change in dark current causes the voltage of OUT_CSA to be outside the range set by the upper and lower voltage thresholds, which in turn prompts the digital control adjust Idigital 150A of Icorrection 150 to compensate for the change in dark current and residual error.

Digital control 260 drives adjustable current source 270 based on WDU 235 and WDD 250. Adjustable current source 270 generates Idigital 150A to offset dark current from photon detector 120 at the input of CSA 110. In this example, Icorrection 150 includes Idigital 150A from adjustable current source 270 and Ianalog 150B from analog compensation circuit 145. In example dark current compensation circuits without an analog compensation circuit, Icorrection includes only Idigital from the adjustable current source. Digital control 260 updates Idigital 150A in near real time, allowing transients in the dark current to be corrected.

Digital control 260 does not make adjustments to Idigital 150A in response to EVENT 174 being logic high, such that current increases due to photons incident on photon detector 120 do not prompt digital control 260 to change a value of Idigital 150A. Watchdog comparators 230 and 245 operate more slowly than event control 170, such that digital control 260 receives an updated EVENT 174 from event control 170 before it receives the updated WDU 235 and WDD 250. This ensures that digital control 260 does not make adjustments to Idigital 150A in response to photons incident on detector 120, and also reduces power used by watchdog comparators 230 and 245.

Digital control 260 can be any appropriate controller, such as one or more microcontrollers, one or more processing units, and the like. In some example dark current compensation circuits, each photon detector channel has its own digital controller. Digital control 260 can be chosen to accommodate available area on the integrated circuit including dark current compensation circuit 200. Because dark current compensation circuit 200 and digital control 260 are gated in response to photons incident on detector 120, the energy drift in response to the event rate is reduced. Digital control 260 also enables dark current compensation circuit 200 to correct a larger range of dark current values, limited only by the DAC range and resolution of adjustable current source 270.

In some examples, dark current compensation circuit 200 also includes an optional analog compensation circuit 145 to generate Ianalog 150B. Icorrection 150 includes Idigital 150A from adjustable current source 270 and Ianalog 150B from analog compensation circuit 145. Analog compensation circuit 145 compensates for residue dark current during detection periods in which photons incident on detector 120 prompt digital control 260 to maintain a value of Idigital 150A without adjustment.

For example, while EVENT 174 is logic high and digital control 260 does not adjust a value of Idigital 150A, analog compensation circuit 145 adjusts a value of Ianalog 150B in response to voltage transients resulting from photons incident on photon detector 120, changing a value of Icorrection 150. Analog compensation circuit 145 provides an impedance and a corresponding voltage drop across it, which allows it to respond to changes in dark current. In example dark current compensation circuit 200, analog compensation circuit 145 presents as a 2 megaohm (MΩ) impedance. For dark current less than 20 nA, analog compensation circuit 145 causes a voltage drop of approximately 40 mV. Although a 40 mV voltage drop would suppress input current pulses from photons incident on detector 120 if used alone, in combination with digital control 260 analog compensation circuit 145 reduces the active correction range for digital control 260.

Analog compensation circuit 145 also reduces the active correction range of digital control 260. For example, adjustable current source 270 has a resolution of 10 nA and bias voltage INCM is 250 mV. Analog compensation circuit 145 presents as a 2 MΩ impedance and causes a voltage drop of approximately 20 mV in response to a 10 nA change in dark current. Because analog compensation circuit 145 adjusts Ianalog 150B in response to voltage changes in OUT_CSA 124 less than 20 mV, the upper voltage threshold Vthu 225 is set to 270 mV and the lower threshold Vthd 240 is set to 230 mV. The 40 mV range with analog compensation circuit 145 allows digital control 260 to actively correct dark current and adjust Idigital 150A less frequently than with the 10 mV range without analog compensation circuit 145.

Analog compensation circuit 145 is also used to compensate for residue dark current below the resolution of adjustable current source 270. For example, digital control 260 and adjustable current source 270 have a resolution of one nA and dark current from detector 120 is 5.2 nA. Digital control and adjustable current source 270 can generate a 5 nA Idigital 150A and analog compensation circuit 145 is used to generate an additional 0.2 nA current Ianalog 150B to be added to Idigital 150A, resulting in a 5.2 nA Icorrection 150. Analog compensation circuit 145 may be any appropriate analog circuit providing an impedance within dark current compensation circuit 200.

Figure 3:
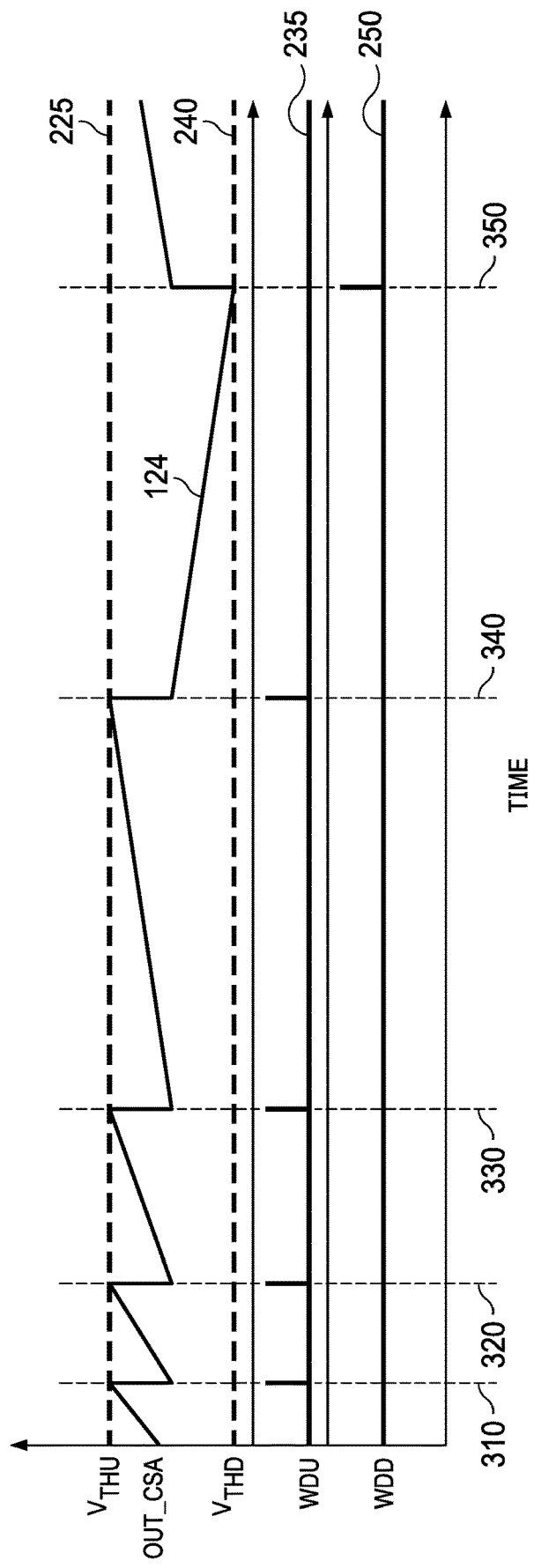
FIG. 3 illustrates an example signal diagram for the example dark current compensation circuit shown in FIG. 2.

FIG. 3 illustrates an example signal diagram for the example dark current compensation circuit 200 shown in FIG. 2. OUT_CSA 124 illustrates the output from CSA 110 in response to a photon incident on detector 120. In response to OUT_CSA 124 increasing above Vthu 225 such as at 310, 320, 330, and 340, WDU 235 becomes logic high and prompts digital control 260 to adjust Icorrection 150 such that OUT_CSA 124 remains less than Vthu 225. In response to OUT_CSA 124 decreasing below Vthd 240 such as at 350, WDD 250 becomes logic high and prompts digital control 260 to adjust Icorrection 150 such that OUT_CSA 124 greater than Vthd 240.

Figure 4:
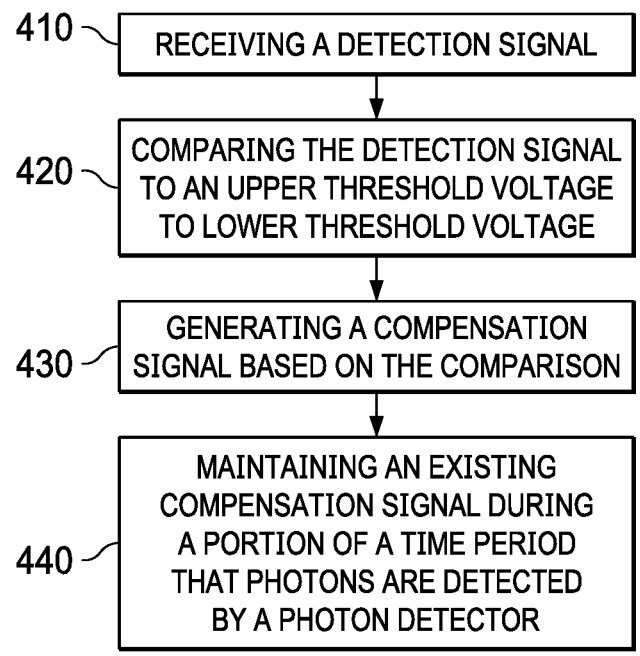
FIG. 4 illustrates an example method to compensate for dark currents in a photon counting system.

FIG. 4 illustrates an example method to compensate for dark currents in a photon counting system. At 410, a detection signal representing photons incident on a photon detector is received, for example OUT_CSA 124 output by CSA 110 of FIGS. 1 and 2. At 420, the detection signal is compared to an upper threshold voltage and a lower threshold voltage, such as Vthu 225 and Vthd 240 respectively from FIG. 2. At 430, a compensation signal to offset the dark currents is generated. For example, Icorrection 150 is generated by dark current compensation circuit 200 shown in FIG. 2.

At 440, an existing compensation signal is maintained during a time period in which photons are detected by a photon detector. Adjustment of the compensation signal is disabled in response to detecting photons incident on the photon detector, for example by event control 170 shown in FIGS. 1 and 2. In some examples, adjustment of the compensation signal by a digital compensation circuit is disabled at 440 while an analog compensation circuit continues to adjust the compensation circuit in response to detecting photons incident on the photon detector, for example analog compensation circuit 145 shown in FIGS. 1 and 2.

In view of the foregoing structural and functional features described above, an example method will be better appreciated with reference to FIG. 4. While for simplicity of explanation the method is shown and described as executing serially, the method is not limited by the illustrated order, as parts of the method could occur in different orders and/or concurrently from that shown and described herein with reference to FIG. 4. Such method can be executed by various components configured in an integrated circuit, such as a processor or a controller for example.

Figure 5:
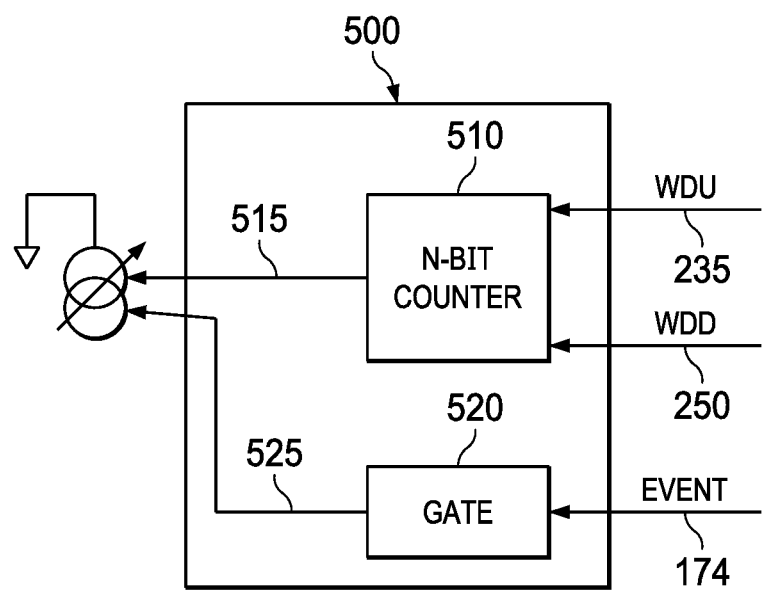
FIG. 5 illustrates an example digital controller for use in a dark current compensation circuit.

FIG. 5 illustrates an example digital controller 500 for use as digital control 260 in dark current compensation circuit 200 shown in FIG. 2. Digital controller 500 includes an n-bit counter 510 and a gate 520, where n is the resolution of the digital to analog converter (DAC) associated with the dark current compensation circuit. N-bit counter 510 receives WDU 235 and WDD 150, which increment and decrement the value of n-bit counter 510 respectively. N-bit counter 510 outputs a signal 515 which indicates a value of Icorrection 150 adjustable current source 270 should generate. Gate 520 receives EVENT 174 and outputs a signal 525 to prevent adjustments to Icorrection 150 in response to a logic high value of EVENT 174 while photons are incident on detector 120. Digital controller 500 enables dark current compensation circuit 200 to correct a larger range of dark current values, limited only by the DAC range and resolution of adjustable current source 270. Because adjustable current source 270 is gated in response to photons incident on detector 120, the energy drift in response to the event rate is reduced.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A circuit, comprising:
   a first comparator having a first input configured to receive a detection signal and a second input configured to receive a first voltage;
   a second comparator having a third input configured to receive the detection signal and a fourth input configured to receive a second voltage;
   a controller coupled to the first and second comparators, the controller having an input configured to receive an event signal; and
   an adjustable current source coupled to the controller and configured to generate a compensation current, wherein the controller causes the adjustable current source to maintain a constant value of the compensation current in response to the event signal indicating photons incident on a photon detector.

2. The circuit of claim 1, wherein the first voltage is greater than the second voltage.

3. The circuit of claim 1, further comprising an analog sub-circuit coupled to the adjustable current source and configured to receive the detection signal, wherein the analog sub-circuit is configured to generate an analog compensation current based on the detection signal.

4. The circuit of claim 1, wherein the controller receives the event signal before output signals from the first and second comparators.

5. The circuit of claim 1, wherein the controller comprises a counter and a logic gate.

6. The circuit of claim 5, wherein the counter is configured to increment in response to a first comparator output being logic high.

7. The circuit of claim 5, wherein the counter is configured to decrement in response to a second comparator output being logic high.

8. The circuit of claim 5, wherein the logic gate is configured to output a control signal for the adjustable current source, the control signal preventing a change in the compensation current in response to the event signal indicating photons incident on a photon detector.

9. A photon counting circuit, comprising:
   a charge sensitive amplifier (CSA) circuit, comprising:
      an amplifier having an input configured to receive current from a photon sensor and an output,
      a capacitor in a feedback path from the amplifier output to the amplifier input, and
      a switch in parallel with the capacitor in the feedback path; and
   a dark current compensation circuit, comprising:
      a first comparator coupled to the amplifier output, the first comparator having an input configured to receive a first voltage and having an output,
      a second comparator coupled to the amplifier output, the second comparator having an input configured to receive a second voltage and having an output,
      a processing unit (PU) coupled to the first and second comparator outputs, the PU having an input configured to receive an event detection signal and having an output to adjust a value of a compensation current based on the first and second comparator outputs, and
      an adjustable current source coupled to the PU output and the amplifier input.

10. The photon counting circuit of claim 9, wherein the dark current compensation circuit further comprises an analog sub-circuit coupled from the amplifier output to the amplifier input, and wherein the analog sub-circuit generates an analog compensation current based on the amplifier output.

11. The photon counting circuit of claim 9, further comprising an event detection circuit coupled to the amplifier output, the event detection circuit having an output to provide the event detection signal to the PU.

12. The photon counting circuit of claim 11, wherein the event detection circuit operates more quickly than the first and the second comparators, and wherein the PU receives the event detection signal before the first and second comparator outputs.

13. The photon counting circuit of claim 11, wherein the event detection circuit comprises a comparator coupled to the amplifier output, the comparator having an input configured to receive a third voltage.

14. The photon counting circuit of claim 13, wherein the event detection signal is indicative of photons incident on a photon detector.

15. The photon counting circuit of claim 11, further comprising a high pass filter coupled between the amplifier output and the event detection circuit.

16. The photon counting circuit of claim 15, wherein an output of the high pass filter is provided to an analog to digital converter.

17. The photon counting circuit of claim 9, wherein the first comparator output is logic high in response to the amplifier output being greater than the first voltage.

18. The photon counting circuit of claim 9, wherein the second comparator output is logic high in response to the amplifier output being less than the second voltage.

19. The photon counting circuit of claim 9, wherein the PU maintains a constant output without adjustment in response to the event detection signal indicating photons incident on a photon detector.

* * * * *